United States Patent [19]

Williams et al.

[11] 3,813,561

[45] May 28, 1974

[54] VOLTAGE CONTROL SWITCH DRIVER

[75] Inventors: Heyward Sturges Williams, Amherst; Robert Robbins, Hudson, both of N.H.

[73] Assignee: LRC, Inc., Hudson, N.H.

[22] Filed: Oct. 16, 1972

[21] Appl. No.: 297,808

[52] U.S. Cl. .................. 307/263, 307/228, 307/256, 307/310, 328/142, 307/229

[51] Int. Cl. .................. H03k 1/14, H03k 6/04

[58] Field of Search .................. 328/142, 143; 307/259, 307/228, 229, 310, 263

[56] References Cited

UNITED STATES PATENTS

| | | | |
|---|---|---|---|
| 2,831,107 | 4/1958 | Raymond et al. | 328/142 |
| 2,981,832 | 4/1961 | Mattson | 307/259 X |
| 3,277,318 | 10/1966 | Bedford | 307/259 |
| 3,341,654 | 9/1967 | Pay et al. | 328/143 X |
| 3,440,446 | 4/1969 | Higginbotham | 307/310 X |
| 3,475,700 | 10/1969 | Ertel | 307/259 |

*Primary Examiner*—John S. Heyman
*Attorney, Agent, or Firm*—Joseph S. Iandiorio

[57] ABSTRACT

A diode switch driver circuit which utilizes a composite voltage having a composite slope including a first slope up to a predetermined region corresponding to the diode breakover region, and a second slope beyond that predetermined region for optimizing the linearity of the attenuation characteristic of a driven diode switch relative to the input drive voltage of the switch driver circuit comprising slope generating means, responsive to the input drive voltage, for producing a voltage having one of the first and second slopes; level shifting means, connected with the slope generating means for varying the voltage level of the voltage having one of the first and second slopes; and an output stage including a current amplifier circuit having a high input impedance and low output impedance responsive to the voltage having one of the first and second slopes for producing an output drive voltage for operating a diode switch.

8 Claims, 2 Drawing Figures

PATENTED MAY 28 1974 3,813,561

VOLTAGE CONTROL SWITCH DRIVER

FIELD OF INVENTION

Figure 1:
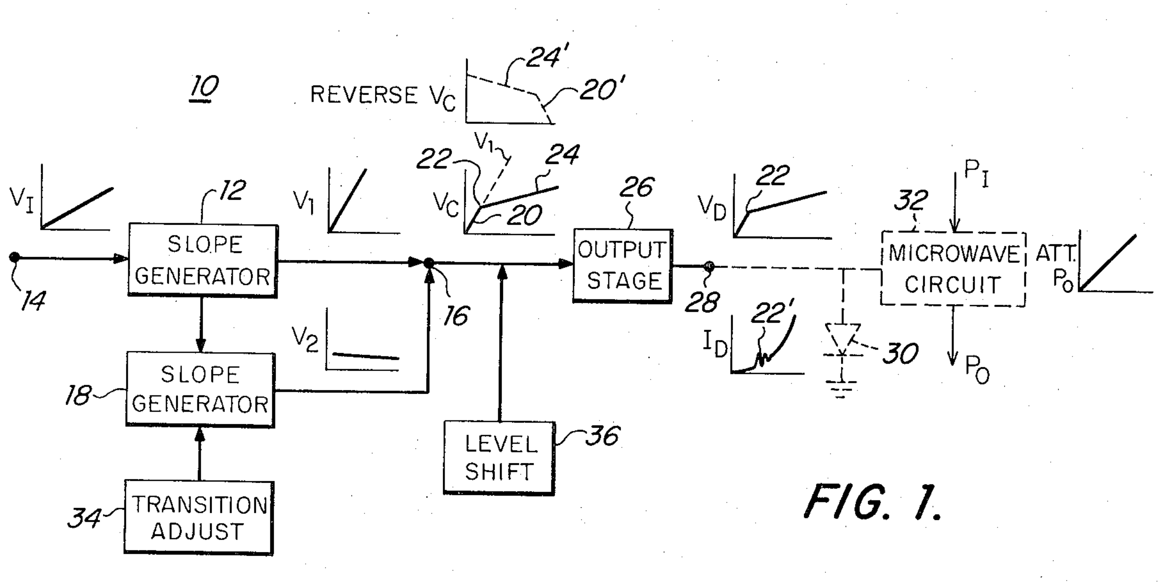

This invention relates to a diode switch driver circuit for achieving attenuation linearity.

BACKGROUND OF INVENTION

Switch driver circuits are used to drive a variety of switching devices. One common use of switch drivers is to drive diode switches especially those diode switches such as PIN diodes which are used to attenuate power transmitted by microwave circuits. Such diodes may be placed in shunt configuration wherein increasing current to the diode increases the power drain on the microwave circuit and increases the attenuation of its power output or in series configuration wherein increasing current to the diode decreases the power drain on the microwave circuit and decreases the attenuation of its power output. Typically a diode switch driver has available at its input a voltage signal which may vary over a defined range e.g. 0 – 5 volts. Ideally it is desired that as the voltage at the input to the diode switch driver varies the attenuation in decibels of the power output of the microwave circuit also varies linearly with espect to the input to the diode switch. To accomplish this the current through the diode must vary approximately exponentially. Conventional switch drivers achieve this by generating an approximately exponential current output to the diode in response to the linearly increasing voltage input. The diode forward respect current characteristic is not a perfect exponential function and it contains an irregular region or breakdown region near the low end of conduction. One prior art approach has used a switch driver circuit that includes a number of current sources which are switched in and out to construct the desired output current characteristic. These circuits are complex and relatively slow acting: typically requiring switching time in the order of microseconds. One reason for this is that at low current levels the voltage across the diode requires a long time to be established. Attempts to use capacitors to reduce the time is not satisfactory because a capacitance value suitable at one current level is not satisfactory at other current levels. Since such driver circuits use a number of different current sources to generate the current characteristic for the diode, the characteristic includes a number of segments separated by transition regions; each one of these segments must be carefully adjusted as to slope and each breakover point carefully adjusted as to location for each diode in order to obtain a reasonably linear attenuation. Because of the many current sources required temperature compensation to maintain linearity is also difficult.

SUMMARY OF INVENTION

It is therefore an object of this invention to provide an improved, simpler, diode switch driver circuit which generates a voltage output to operate a diode switch.

It is a further object of this invention to provide such a driver circuit which has a lower impedance and much shorter response time than prior art circuits.

It is a further object of this invention to provide such a driver circuit which generates a composite voltage having only two different segments with but two different slopes and one transition region between them corresponding to the diode breakdown region.

It is a further object of this invention to provide such a driver circuit which is easy to adjust for optimum attenuation linearity for each diode switch.

It is a further object of this invention to provide such a switch driver circuit which is easily compensated for internal temperature drift and provides a simple temperature compensation for the diode switch as well.

The invention results from the realization that the complex conventional driver circuits which produce a current characteristic similar to the diode current characteristic in order to control the diode conduction and obtain attenuation linearity could be replaced by a much simpler and more effective driver circuit which developed a voltage across the diode that resulted in that very current characteristic being generated internally by the diode itself.

The invention features a diode switch driver circuit which utilizes a composite voltage having a composite slope including a first slope up to a predetermined region corresponding to the diode breakover region and a second slope beyond that predetermined region for optimizing the linearity of the attenuation characteristic of a driven diode switch relative to the input drive voltage of the switch driver circuit. The circuit includes slope generating means responsive to the input drive voltage for producing a voltage having one of the first and second slopes. Level shifting means connected with the slope generating means enable variation of the voltage level of the voltage having the one of the first and second slopes. An output stage includes a current amplifier circuit having a high input impedance and a low output impedance which is responsive to the voltage having one of the first and second slopes for producing an output drive voltage for operating a diode switch.

DISCLOSURE OF PREFERRED EMBODIMENT

Figure 2:
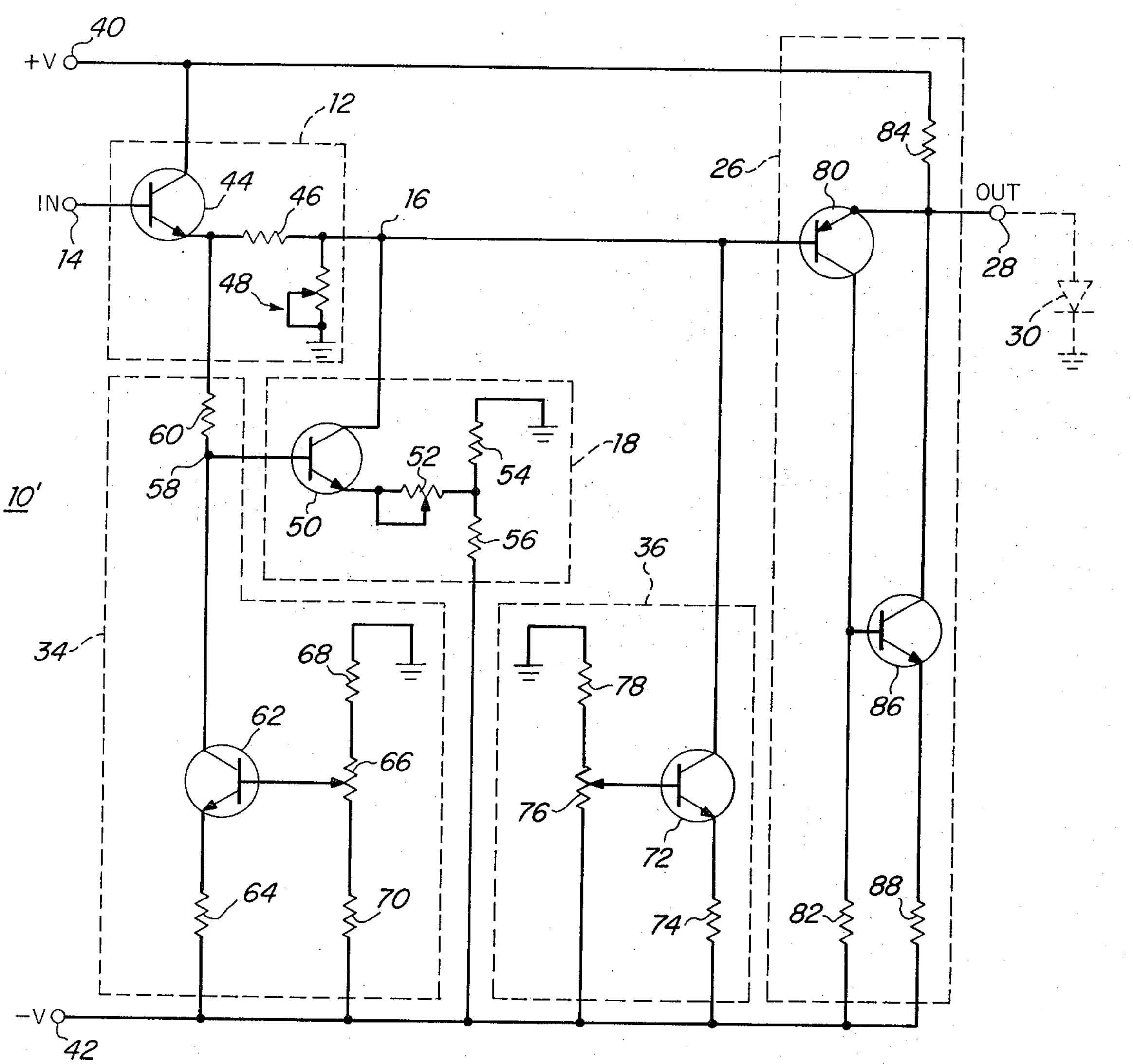

Other objects, features, and advantages will occur from the following description of a preferred embodiment and the accompanying drawings, in which:

FIG. 1 is a schematic, block diagram of a diode switch driver circuit according to this invention; and FIG. 2 is a more detailed schematic, diagram of a diode switch driver circuit according to this invention.

There is shown in FIG. 1 a diode switch driver circuit 10 including a first slope generator 12 which receives an input voltage $V_I$ from input terminal 14 and produces an output voltage $V_1$ to an operation point 16. The output voltage $V_1$ is linear with respect to voltage $V_I$. The second slope generator 18 also responsive to the input voltage $V_I$ at input terminal 14 provides second output voltage $V_2$ to operating point 16. Voltage $V_2$ has a somewhat shallower slope than voltage $V_1$. Operating point 16 may be a simple summing point or a more elaborate means of combining voltages $V_1$ and $V_2$. The combination of voltages $V_1$ and $V_2$ results in a composite voltage $V_C$ which includes a first part, segment 20, formed by voltage $V_1$ up to a predetermined region 22 and a second, compound segment 24, formed by the combination of $V_1$ and $V_2$. This composite voltage is submitted to output stage 26 which provides it at output terminal 28 as output voltage $V_D$. Output voltage $V_D$ is applied across the microwave diode switch 30, shown in phantom, and produces through it a characteristic current shown as $I_D$. As the voltage $V_D$ increases across diode 30 the current $I_D$ through diode 30 increases approximately exponentially; as the diode current $I_D$ increases exponentially the power shunted from the microwave circuit 32 also increases; this results in the power out, $P_O$, of the microwave circuit decreasing and causes an increasing attenuation of the power out. The attenuation of the power out, $P_O$, thus increases linearly with respect to the input voltage $V_I$ at input terminal 14.

The transition region 22 in a composite voltage $V_C$ corresponds to the breakover region 22' which occurs in a diode current characteristic $I_D$. Since this breakover region 22' may vary from diode to diode means are provided in the form of transition adjusting circuit 34 to control the point at which slope generator 18 begins to produce the voltage $V_2$; for it is at that point that transition region 22 will occur and the second segment 24 with the shallower slope will begin. Other techniques for obtaining the composite voltage $V_C$ may be used without departing from the scope of this invention. A level shifting circuit 36 may be used to increase or decrease the bias at operating point 16 and thereby shift the composite voltage up and down; also in order to accommodate variations in operating characteristics from diode to diode each of slope generators 12 and 18 may include a slope adjustment mechanism to adjust the slopes of $V_1$ and $V_2$, respectively. Thus to precisely trim a composite voltage $V_C$ for a particular diode it is only necessary to set the slopes for voltages $V_1$ and $V_2$ and using transition adjusting circuit 34 to set the predetermined region 22 to optimize the attainment of current $I_D$ through diode 30 and the linearization of the attenuation of the power out, $P_O$, with respect to the voltage in, $V_I$.

With diode switch 30 connected in shunt as shown in FIG. 1 an increase in voltage at input 14 of driver 10 produces an increase in attenuation of the power output at the microwave circuit 32.

If the diode switch is connected in series then the attenuation of its power output of the microwave circuit will decrease with increasing voltage at the input to the driver circuit. This reverse response may also be obtained using a shunt diode by including inverters in slope generator 12 and 18 and employing them in reverse order, i.e., segment 24 is generated first and segment 20 second as shown at 24' and 20' and using a curve level shifter to shift them upward into the proper quadrant.

In FIG. 2 there is shown a similar circuit 10' in which like parts have been given like numbers. Circuit 10' is connected to a positive power supply at terminal 40 and to a negative power supply at terminal 42. Typically these terminals may be connected to +8 volts and −8 volts, respectively. Slope generator 12 may include a transistor 44 having its base connected to input terminal 14, its collector connected to power supply 40 and its emitter connected to one end of resistor 46, the other end of which is connected to operating point 16. The slope of the output voltage of slope generator 12 may be increased by increasing the value of variable resistance 48.

Slope generator 18 includes a transistor 50 having its collector connected to operating point 16 and its emitter connected to a voltage divider including resistors 54 and 56 connected in series between ground and negative power supply terminal 42. The base of transistor 50 may be connected to a control point 58 at one end of resistor 60 in transition adjusting circuit 34. The other end of resistor 60 is connected to the emitter of transistor 44 in slope generator 12. The remainder of transition adjusting circuit 34 includes a transistor 62 having its collector connected to the control point 58 and its emitter connected through a resistor 64 to the negative power supply terminal 42. The base of transistor 62 may be connected to a variable resistor 66 which forms a part of a voltage divider including resistors 68 and 70, all three resistors being connected in series between ground and the negative power supply terminal 42. Level shifting circuit 36 includes a transistor 72 having its collector connected to the operating point 16 and its emitter connected through a resistor 74 to the negative power supply terminal 42. The base of transistor 72 may be connected to a variable resistor 76 which forms a part of a voltage divider which includes resistor 78 connected between ground and the negative power supply terminal 42. Output stage 26 includes a current amplifier circuit having a high input impedance and low output impedance including a transistor 80 having its base connected to operating point 16 and its collector connected through resistor 82 to the negative power supply terminal 42. The emitter of transistor 80 is connected to outut terminal 28 and through limiting resistor 84 to the positive power supply 40. A second transistor 86 has its base connected between resistor 82 and the collector of transistor 80 and its emitter connected through a resistor 88 to the negative power supply terminal 42; its collector is connected to limiting resistor 84 and output terminal 28.

In operation, as the voltage at input terminal 14 increases, transistor 44 will conduct more heavily. The emitter of transistor 44 will therefore become more positive causing the operating point 16 to also become more positive. As operating point 16 becomes more positive the base of transistor 80 is also driven more positive. The base of transistor 80 must be more negative than its emitter for transistor 80 to conduct; transistor 80 is normally in a highly conducting state. Thus an increase in the positive direction of operating point 16 tends to cut off transistor 80. As transistor 80 becomes less conducting, its emitter rises toward the positive potential at positive power supply terminal 40, and this in turn provides an increase, in the positive direction, in the voltage at output terminal 28 and across diode switch 30. Thus the voltage at output terminal 28 linearly follows the input voltage at input terminal 14. Variable resistor 48 controls the slope of the output voltage $V_1$ of slope generator 12; as the resistance of variable resistor 48 is increased operating point 16 becomes more positive and the slope increases; as the resistance of variable resistor 48 is decreased the voltage at operating point 16 decreases and the slope of output voltage $V_1$ decreases.

In level shifting circuit 36, transistor 72 is normally conducting. When variable resistance 76 is adjusted to increase the positive voltage at the base of transistor 72, transistor 72 will conduct more heavily, drawing operating point 16 in the negative direction and shifting the composite voltage downward. Conversely, if the voltage on the base of transistor 72 is decreased, transistor 72 will be less conducting and operating point 16 will increase in the positive direction shifting the composite voltage upward. Resistor 74 may be made adjustable in addition to or instead of variable resistor 76.

In transition adjusting circuit 34, transistor 62 operates as a constant current source; its base is connected to a fixed voltage by way of variable resistor 66 and its emitter is also at a fixed voltage resulting in a fixed current through resistor 64. The fixed current through resistor 64 requires that a fixed current pass through resistor 60 and therefore the voltage across resistor 60 is kept fairly constant, for example, 5.4 volts.

In slope generator 18, transistor 50 has its emitter set at approximately, for example, −5.3 volts, by the combination of variable resistor 52 and resistors 54 and 56. Thus, typically, the base of transistor 50 is 0.1 of a volt more negative (5.4 volts) than its emitter and transistor 50 will not conduct. As the voltage at input terminal 14 increases and the emitter of transistor 44 becomes more positive, control point 58 also becomes more positive. When control point 58 is moved in the positive direction sufficiently so that the base of transistor 50 becomes positive with respect to its emitter, transistor 50 begins to conduct and the second output voltage $V_2$ begins to be generated. The precise point at which the second voltage $V_2$ begins to be generated is determined by the voltage which is set on control point 58 and this voltage is in turn controlled by the current flowing through resistors 60 and 64 of transistor 62, all of which is controlled by the setting of the voltage on the base of transistor 62 by the variable resistor 66. The slope of the second voltage $V_2$ may be adjusted by means of variable resistor 52.

Some temperature compensation is required internally in circuit 10' in order to keep operating point 16 stable, for it is operating point 16 which precisely controls the conduction of transistor 80 and so controls the output voltage at terminal 28. This is accomplished as follows. The base to emitter voltage drop of transistor 44 is +0.6 of a volt at 25°C; at 125°C the base to emitter drop is +0.4; thus as the temperature of circuit 10' increases, the voltage at the emitter of transistor 44 will rise, raising the voltage of operating point 16 as well. To compensate for this, transistor 72 is the same type of transistor having the same 0.6 of a volt drop from its base to its emitter which reduces to +0.4 of a volt at a 125°C. However, the drop in base to emitter voltage of transistor 72 decreases the voltage across resistor 74 and thus decreases the voltage at operating point 16. Thus any rise in temperature which would cause transistor 44 to tend to increase the voltage at operating point 16 simultaneously causes transistor 72 to tend to lower the voltage at operating point 16, thereby maintaining operating point 16 stable with respect to temperature. The compensation action of transistors 44 and 72 can be made more precise by making resistor 74 equal to resistor 46.

The second internal temperature compensating system involves transistors 44, 50 and 62. The base of emitter voltage drop of transistor 44 is 0.6 of a volt at 25°C and 0.4 of a volt at 125°C. Thus the voltage at the emitter of transistor 44 increases with temperature as explained previously. Increasing the voltage on the emitter of transistor 44 also increases the voltage at control point 58. Assuming an increase from 25°C to 125°C the voltage at control point 58 increases by 0.2 of a volt. Transistor 50 which is the same type of transistor as transistor 44 also has a base to emitter voltage drop of 0.6 of a volt at 25°C and 0.4 at 125°C. Thus the emitter of transistor 50 is 0.4 of a volt higher at 125°C than it is at 25°C because of the 0.2 of a volt loss across its own junction combined with the 0.2 of a volt loss across the junction of transistor 44 which is reflected at control point 58. Such an increase on the emitter of transistor 50 can substantially change the transition region in which the second output voltage $V_2$ begins to be generated. To compensate for this, transistor 62 which is of the same type as transistors 44 and 50 and also has the same 0.6 of a volt drop from its base to emitter also experiences 0.4 of a volt drop at 125°C. But the current required to establish the 0.2 of a volt difference at transistor 62 must flow through resistor 64 and resistor 60. If then resistor 60 is made to have twice the resistance of resistor 64 and the same current flows through both, the drop through resistor 60 will be 0.4 of a volt while the drop across resistor 64 is only 0.2 of a volt. This 0.4 of a volt drop across resistor 60 just offsets the 0.4 of a volt increase and thereby maintains the emitter of transistor 50 at a stable voltage independent of temperature.

In very high speed applications where the operation of transistor 62 in a saturated condition would slow down the operation of the circuit transistor 62 may be brought out of saturation by increasing the value of the negative voltage supplied at power supply terminal 42 so that the base to emitter circuit of transistor 62 has the same voltage across it but shifted higher in the negative direction. This results in providing a higher voltage across the collector and emitter and removing transistor 62 from the saturated condition.

Transistor 80 is connected in an emitter follower configuration which provides a very low output impedance through output terminal 28 and diode 30. This permits very high speed operation in which current to diode 30 can be increased or decreased very rapidly, i.e. a response time of 1–10 nanoseconds. Prior art devices are typically three orders of magnitude slower, operating in the area of 1–10 microseconds. Current limiting resistor 84 prevents an overload current from destroying diode 30 even in the event that transistors 80 and 86 were both not conducting. Temperature compensation for diode 30 is provided by the base to emitter junction of transistor 80 which is of the same type as the junction in diode 30. Thus the anode to cathode voltage drop across diode 30 is 0.6 of a volt and so is the emitter to base voltage drop of transistor 80. An increase of temperature would make diode 30 conduct more heavily and substantially increase the power attenuation of the microwave circuit. However, as the temperature increases the emitter to base drop of transistor 80 decreases so that the voltage across diode 30 decreases in the same amount as the conduction tends to increase, and therefore maintains the diode 30 in a stable condition independent of temperature. Since transistor 80 acts to compensate for effects of temperature on diode 30 it is preferable that both are subject to the same ambient conditions. Thus transistor 86 has been added to carry the greater portion of the current delivered through resistor 84. This leaves transistor 80 conducting only a very low current required to drive the base of transistor 86. A second advantage results from the use of transistor 86, namely, the reduced current flowing through the emitter to collector circuit of transistor 80 substantially reduces the emitter to base current which may introduce error into the operations of circuits 12 and 36; the reduction of this current by the reduction of the main current through the emitter and collector makes this error negligible. If the emitter to base junction of transistor 80 is not sufficient to precisely compensate for temperature variations on the junction of diode 30 resistor 74 may be increased or decreased to compensate for the discrepancy, provided that the change through resistor 74 would not be so great as to render completely ineffective the temperature compensation in effect between transistor 72 and transistor 44.

Transistors 44, 50, 62 and 72 and their associated circuitry may all be contained in a single integrated circuit package such as an SG3821 made by Silicon General, Inc. Transistor 80 may be a 2N4209A and transistor 86 a 2N2369A. The resistors may have the following values: resistor 46, 1.78 Kohms; resistor 48, 1,500 ohms; resistor 60 2 Kohms; resistor 64, 1 Kohms; resistor 52, 1.5 Kohms; resistor 54, 2 Kohms; resistor 56, 1 Kohm; resistors 66 and 68, 500 ohms; resistor 70, 200 ohms; resistor 78, 1,000 ohms; resistor 76, 200 ohms; resistor 74, 1.78 Kohms; resistor 82, 3.9 Kohms; resistor 88, 160 ohms; and resistor 84, 680 ohms.

Although the invention has been illustrated with a circuit using two slope generators with an output stage including a current amplifier circuit including temperature compensation means, current limiting means and low output impedance and various slope adjusting, level shifting and temperature compensating means these are not all limitations of the invention. For example in simple form where operation over wide temperature range is not contemplated slope adjustments are not critical and only a limited range of attenuation is desired the device of this invention may be implemented using one slope generator to generate either $V_1$ or segment 24 of $V_C$ directly without combining $V_1$ and $V_2$, a level shifter to set the position of that voltage and an output stage including a current amplifier circuit having a high input impedance and a low output impedance.

A well regulated power supply and precision resistors should be used for best results. Although the circuit has been illustrated using PNP and NPN transistors other types of semiconductors may be used, in addition the polarity of the power supply connections may be reversed and complementary transistors used to effect the same result.

Other embodiments will occur to those skilled in the art and are within the following claims:

What is claimed is:

1. A dual slope diode switch driver circuit for generating a composite voltage for producing an exponential current flow, through a diode switch, approximating the diode characteristic current flow; comprising:

a first slope generator responsive to an input drive voltage for generating a first voltage having a first slope;

a second slope generator responsive to said input drive voltage for generating a second voltage beginning a predetermined period after the start of said first voltage and having a second slope;

a transition adjusting cicuit, responsive to said input drive voltage, for setting said second slope generator to commence to generate said second voltage at the diode breakover region;

combining means, responsive to said first voltage from said first slope generator and said second voltage from said second slope generator, for forming a composite voltage having a composite slope formed from said first slope up to a predetermined region containing said point at which said second slope generator commences to generate said second voltage, and corresponding to the diode breakover region, and a compound slope formed from a combination of said first and second voltages beyond said predetermined region, for inducing a current flow in said diode approximating the characteristic diode current.

2. The dual slope diode switch driver circuit of claim 1 in which said combining means includes an output stage including a current amplifier circuit, having a high input impedance and low output impedance, responsive to said composite voltage to produce an output drive voltage for operating said diode switch.

3. The dual slope diode switch driver of claim 1 in which said transition adjusting circuit includes a constant current source for setting the bias to said second slope generator and means for varying the setting of said bias.

4. The dual slope diode switch driver circuit of claim 1 further including a level adjusting circuit for setting the voltage level of said composite voltage at said combining means, and means for varying the setting of said level.

5. The dual slope diode switch driver circuit of claim 4 in which each of said first slope generating means and said level adjusting circuit includes a transistor having similar characteristics for cancelling voltage changes at said combining means due to temperature variations.

6. The dual slope diode switch driver of claim 5 in which each of said transistors has a resistor of a predetermined value in series with its load terminals.

7. The dual slope diode switch driver of claim 1 in which each of said first and second slope generators and transition adjusting circuit includes a transistor of similar type and a resistor connected between a load electrode of the transistor in said first slope generator and control electrode of the transistor in said second slope generator and in series with a load electrode of the transistor in said transition adjusting circuit is approximately twice the resistance of a resistor connected between the other load electrode of the transistor in said transition adjusting circuit and a power input terminal for providing temperature compensation to stabilize the point at which said second voltage is introduced.

8. A dual slope diode switch driver circuit for generating a composite voltage for producing an exponential current flow, through a diode switch, approximating the diode characteristic current flow, comprising:

a first slope generator responsive to an input drive voltage for generating a first voltage having a first slope;

a second slope generator responsive to said input drive voltage for generating a second voltage beginning a predetermined period after the start of said first voltage and having a second slope;

a transition adjusting circuit, responsive to said input drive voltage, for setting said second slope generator to commence to generate said second voltage at the diode breakover region;

combining means responsive to said first voltage from said first slope generator and said second voltage from said second slope generator for forming a composite voltage having a composite slope formed from said first slope up to a predetermined region containing said point at which said second slope generator commences to generate said second voltage, and corresponding to the diode breakover region and a compound slope formed from a continuation of said first and second voltages beyond said predetermined region, for inducing a current flow in said diode approximating the characteristic diode current; and an output stage including a current amplifier circuit having a high input impedance and a low output impedance responsive to said composite voltage for producing an output drive voltage for operating a diode switch.

* * * * *